US009786541B2

(12) United States Patent
Shinoda et al.

(10) Patent No.: US 9,786,541 B2
(45) Date of Patent: Oct. 10, 2017

(54) DICING SHEET WITH PROTECTIVE FILM FORMING LAYER AND CHIP FABRICATION METHOD

(71) Applicant: LINTEC Corporation, Tokyo (JP)

(72) Inventors: Tomonori Shinoda, Tokyo (JP); Masaaki Furudate, Tokyo (JP); Ken Takano, Tokyo (JP)

(73) Assignee: LINTEC Corporation, Tokyo (JP)

( * ) Notice: Subject to any disclaimer, the term of this patent is extended or adjusted under 35 U.S.C. 154(b) by 630 days.

(21) Appl. No.: 14/347,667

(22) PCT Filed: Sep. 27, 2012

(86) PCT No.: PCT/JP2012/074923
§ 371 (c)(1),
(2) Date: Jun. 5, 2014

(87) PCT Pub. No.: WO2013/047674
PCT Pub. Date: Apr. 4, 2013

(65) Prior Publication Data
US 2014/0295646 A1    Oct. 2, 2014

(30) Foreign Application Priority Data

Sep. 30, 2011    (JP) ................ 2011-217767
Sep. 30, 2011    (JP) ................ 2011-217769

(51) Int. Cl.
*B32B 7/12*    (2006.01)
*H01L 21/683*  (2006.01)
*H01L 21/304*  (2006.01)
*H01L 21/78*   (2006.01)
*C09J 7/02*    (2006.01)
*H01L 23/544*  (2006.01)

(52) U.S. Cl.
CPC ........ *H01L 21/6836* (2013.01); *C09J 7/0225* (2013.01); *H01L 21/304* (2013.01); *H01L 21/78* (2013.01); *H01L 23/544* (2013.01); *C09J 2201/622* (2013.01); *C09J 2203/326* (2013.01); *H01L 2221/68327* (2013.01); *H01L 2221/68377* (2013.01); *H01L 2223/54406* (2013.01); *H01L 2223/54433* (2013.01); *H01L 2223/54486* (2013.01); *H01L 2924/0002* (2013.01); *Y10T 428/24843* (2015.01)

(58) Field of Classification Search
None
See application file for complete search history.

(56) References Cited

U.S. PATENT DOCUMENTS

| 5,705,016 A | * | 1/1998 | Senoo | B28D 5/0082 156/289 |
| 5,882,956 A | * | 3/1999 | Umehara | H01L 21/304 257/E21.237 |
| 6,007,920 A | * | 12/1999 | Umehara | H01L 21/304 257/E21.237 |
| 7,060,339 B2 | * | 6/2006 | Matsumura | C09J 7/02 156/289 |
| 7,285,334 B1 | * | 10/2007 | Yamashita | H01M 2/0267 428/220 |
| 7,514,143 B2 | | 4/2009 | Matsumura et al. | |
| 8,545,979 B2 | * | 10/2013 | Kita | C09J 7/0207 428/343 |
| 9,443,750 B2 | * | 9/2016 | Shinoda | H01L 21/6836 |
| 2002/0137309 A1 | | 9/2002 | Senoo et al. | |
| 2005/0184402 A1 | | 8/2005 | Senoo et al. | |
| 2005/0186762 A1 | | 8/2005 | Senoo et al. | |
| 2006/0102987 A1 | * | 5/2006 | Saiki | H01L 21/67092 257/632 |
| 2008/0260982 A1 | | 10/2008 | Senoo et al. | |
| 2010/0133703 A1 | * | 6/2010 | Karasawa | C08G 59/38 257/777 |
| 2014/0065414 A1 | | 3/2014 | Tamura et al. | |
| 2015/0024576 A1 | * | 1/2015 | Shinoda | H01L 21/6836 438/464 |
| 2015/0228526 A1 | * | 8/2015 | Saeki | C09J 7/0246 438/464 |
| 2016/0218077 A1 | * | 7/2016 | Azuma | C09J 7/02 |

FOREIGN PATENT DOCUMENTS

| JP | 2002280329 A | 9/2002 |
| JP | 2003105278 A | 4/2003 |
| JP | 2003138228 A | 5/2003 |

(Continued)

OTHER PUBLICATIONS

Yusuke, Nezu et al., "Tape for Processing Wafers", English translation of JP 2010-034542 A, dated Feb. 12, 2010.*
English abstract of JP2003138228.
English abstract of JP2011032441.
English abstract of JP2011103449.
International Application No. PCT/JP2012/074923, Notification of Transmittal of Translation of the International Preliminary Report on Patentability, dated Apr. 10, 2014.
English abstract of JP2009138026 (A)—Jun. 25, 2009.
Abstract of TWI341555.
Abstract of JP2006140348.
Abstract of JP2008248129.
Abstract of JP2002280329.
Abstract of JP2003105278.
Abstract of WO2010092804.
Abstract of WO2011132648.

*Primary Examiner* — Anish Desai
(74) *Attorney, Agent, or Firm* — Cahn & Samuels, LLP

(57) ABSTRACT

A dicing sheet with a protective film forming layer has a substrate film, an adhesive layer, and a protective film forming layer, and at a minimum, the adhesive layer is formed in an area surrounding the protective film forming layer in a planar view, and the substrate film has the following characteristics (a)-(c): (a) the melting point either exceeds 130° C. or the film has no melting point; (b) the thermal contraction rate under conditions of heating at 130° C. for two hours is from −5 to +5%, and (c) the degree of elongation-to-break in the MD direction and the CD direction is at least 100%, and the stress at 25% is no more than 100 MPa.

10 Claims, 4 Drawing Sheets

(56) References Cited

FOREIGN PATENT DOCUMENTS

| | | |
|---|---|---|
| JP | 2006140348 A | 6/2006 |
| JP | 2008248129 A | 10/2008 |
| JP | 2009138026 A | 6/2009 |
| JP | 2011032441 A | 2/2011 |
| JP | 2011103449 A | 5/2011 |
| TW | I341555 B | 5/2011 |
| WO | 2010/092804 A1 | 8/2010 |
| WO | 2011/132648 A1 | 10/2011 |

* cited by examiner

DICING SHEET WITH PROTECTIVE FILM FORMING LAYER AND CHIP FABRICATION METHOD

This application is a U.S. national stage application of PCT/JP2012/074923 filed on 27 Sep. 2012 which claims priority of Japanese patent documents 2011-217767 filed on 30 Sep. 2011 and 2011-217769 filed on 30 Sep. 2011, the entireties of which are incorporated herein by reference.

TECHNICAL FIELD

The present invention relates to a dicing sheet with a protective film forming layer capable of forming a protective film at the backside of the chip and also capable of improving the production efficiency of the chip. Also, the present invention relates to a production method of the chip using the dicing sheet with the protective film forming layer.

BACKGROUND OF THE INVENTION

Recently, the production of the semiconductor device using the mounting method of so called "face down method" is carried out. In the face down method, the semiconductor chip (hereinafter, it may be referred as "chip") having electrodes such as bumps or so on the circuit surface is used, and said electrodes are bonded with the substrate. Therefore, the face of the opposite side of the circuit face of the chip (the backside of the chip) will be exposed.

The chip backside which has been exposed may be protected by an organic film. Conventionally, the chip having the protective film made of this organic film was obtained by coating the liquid resin on the wafer backside by a spin coat method, then drying and curing followed by cutting the protective film together with the wafer. However, the accuracy of the thickness of the protective film formed as such was not sufficient, hence the yield rate of the product declined in some case.

In order to solve the above problem, the chip protection film having the release sheet, and a protective film forming layer consisting of an energy ray curable component and a binder polymer component which are formed on said release sheet is proposed (Patent article 1).

Further, the semiconductor chip has become thinner and has higher density recently, thus even higher reliability is requested for the semiconductor chip mounted with the protective film when it is exposed to a harsh temperature condition.
[Patent Article 1] JP Patent Application Laid Open No. 2009-138026

SUMMARY OF INVENTION

According to the present inventors, the chip protection film of the Patent article 1 shrinks when curing the protective film forming layer, and a problem of the semiconductor warpage occurred. Particularly, the above problem was prominent when the semiconductor was extremely thin. If the semiconductor warpage takes place, the wafer may be damaged, or the accuracy of the marking (the printing) to the protective film may decline. Also, in the chip protection film of the Patent article 1, it was necessary to adhere the wafer with the protection film to the dicing sheet when producing the chip with the protective film. Also, after the semiconductor wafer is divided into chips by dicing, in order to make the pickup easy, the peripheral part of the dicing sheet is pulled to expand the space between the chips, which is also called as "expansion". Also, when the protective film forming layer is cured by applying the heat, depending on the base of the dicing tape, the base may deform due to the heat, and an the following steps were adversely affected in some case.

The present invention is achieved in view of such circumstances. That is, the object of the present invention is to provide the dicing sheet with the protective film forming layer having high thickness uniformity, capable of easily producing the semiconductor chip with the protective film having excellent printing accuracy, while expandable and the base has the heat resistance.

The present invention includes the following as the gist.

[1] A dicing sheet with a protective film forming layer comprising a base film, an adhesive layer, and a protective film forming layer; wherein
said adhesive layer is at least formed at an area surrounding said protective film forming layer in a planar view, and said base film has following characteristics (a) to (c):
(a) a melting point higher than 130° C., or no melting point,
(b) a thermal shrinkage ratio under the heating at 130° C. for 2 hours is −5 to +5%, and
(c) a rupture elongation of MD direction and CD direction is 100% or more, and a stress at 25% elongation is 100 MPa or less.

[2] The dicing sheet with the protective film forming layer as set forth in [1], wherein said protective film forming layer is thermosetting.

[3] The dicing sheet with the protective film forming layer as set forth in [1] or [2], wherein said protective film forming layer comprises a binder polymer component (A) and a curable component (B).

[4] The dicing sheet with the protective film forming layer as set forth in any one of [1] to [3], wherein said protective film forming layer comprises a coloring agent (C), and a maximum transmittance rate of the protective film forming layer at a wave length of 300 to 1200 nm is 20% or less.

[5] The dicing sheet with the protective film forming layer as set forth in any one of [1] to [4], wherein the protective film forming layer is formed on the adhesive layer of an adhesive sheet comprising of the base film and the adhesive layer,
the protective film forming layer is formed at an inner peripheral part of the adhesive sheet, and
the adhesive layer is exposed at an outer peripheral part of the adhesive sheet.

[6] The dicing sheet with the protective film forming layer as set forth in any one of [1] to [4] comprising the protective film forming layer formed at the inner peripheral part of the base film, and the adhesive layer formed at the outer peripheral part of the base film.

[7] A production method of a chip comprising an adhering of the protective film forming layer of the dicing sheet as set forth in [5] to a workpiece, and carrying out following steps (1) to (3) in an order of any one of [(1), (2), (3)], [(2), (1), (3)], or [(2), (3), (1)];
step (1): obtaining a protective film by curing the protective film forming layer,
step (2): dicing the workpiece and the protective film forming layer or the protective film, and
step (3): releasing between the adhesive sheet and the protective film forming layer or the protective film.

[8] A production method of a chip comprising an adhering of the protective film forming layer of the dicing sheet as set forth in [6] to a work, and carrying out following steps (1) to (3) in an order of any one of [(1), (2), (3)], [(2), (1), (3)], or [(2), (3), (1)];

step (1): obtaining a protective film by curing the protective film forming layer, step (2): dicing the workpiece and the protective film forming layer or the protective film, and step (3): releasing between the base film and the protective film forming layer or the protective film.

[9] The production method of a chip as set forth in [7] or [8], wherein the protective film forming layer is thermosetting, and the steps (1) to (3) are carried out in an order of [(1), (2), (3)] or [(2), (1), (3)].

[10] The production method of the chip as set forth in [9] wherein following step (4) is carried out at any time after the step (1);

step (4): laser printing on the protective film.

When forming the protective film to the backside of the semiconductor chip, by using the dicing sheet with the protective film forming layer according to the present invention, the thickness of the backside of the semiconductor chip is highly uniform, and the protective film having excellent printing accuracy can be easily formed, and the heat curing and the expanding step can be carried out while the dicing sheet is adhered to the semiconductor wafer.

DETAILED DESCRIPTION OF THE INVENTION

Figure 1:
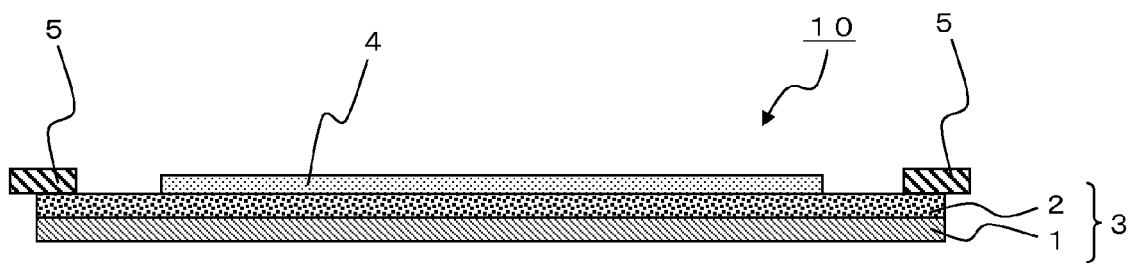
FIG. 1 is a cross section of the dicing sheet with the protective film forming layer according to one embodiment of the present invention.
Figure 2:
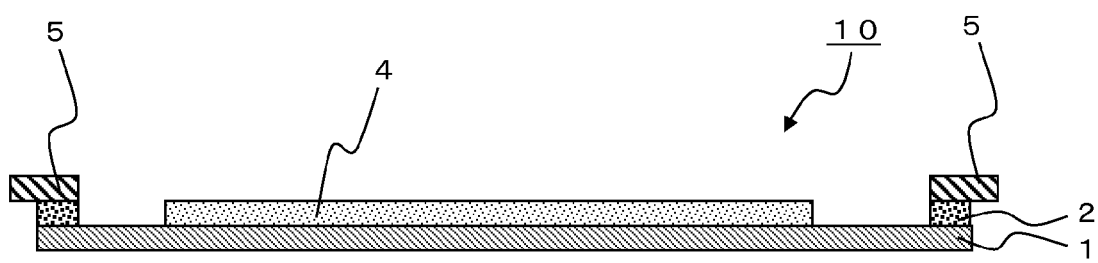
FIG. 2 is a cross section of the dicing sheet with the protective film forming layer according to other embodiment of the present invention.
Figure 3:
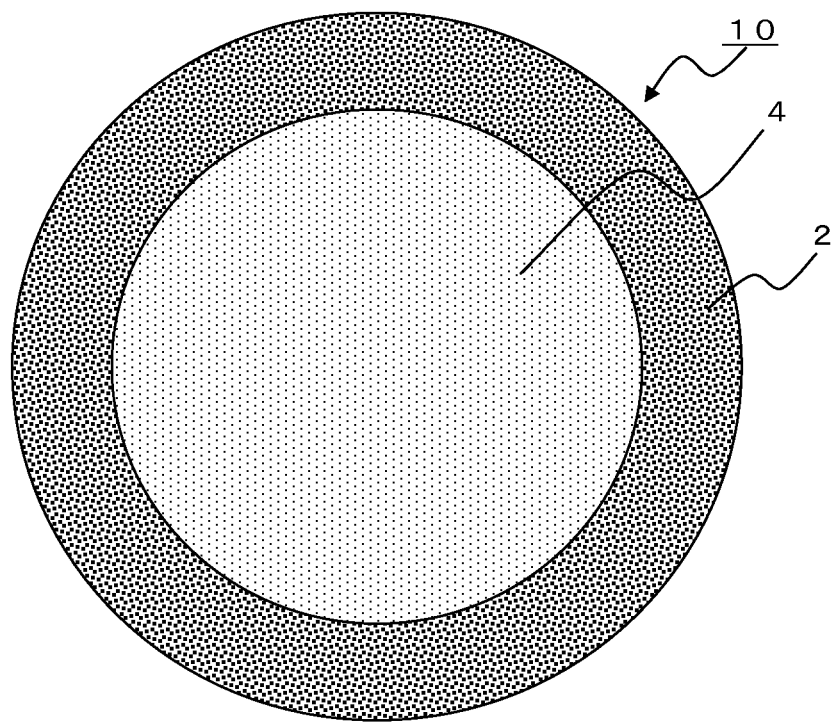
FIG. 3 is a planar view of the dicing sheet with the protective film forming layer of FIG. 1.
Figure 4:
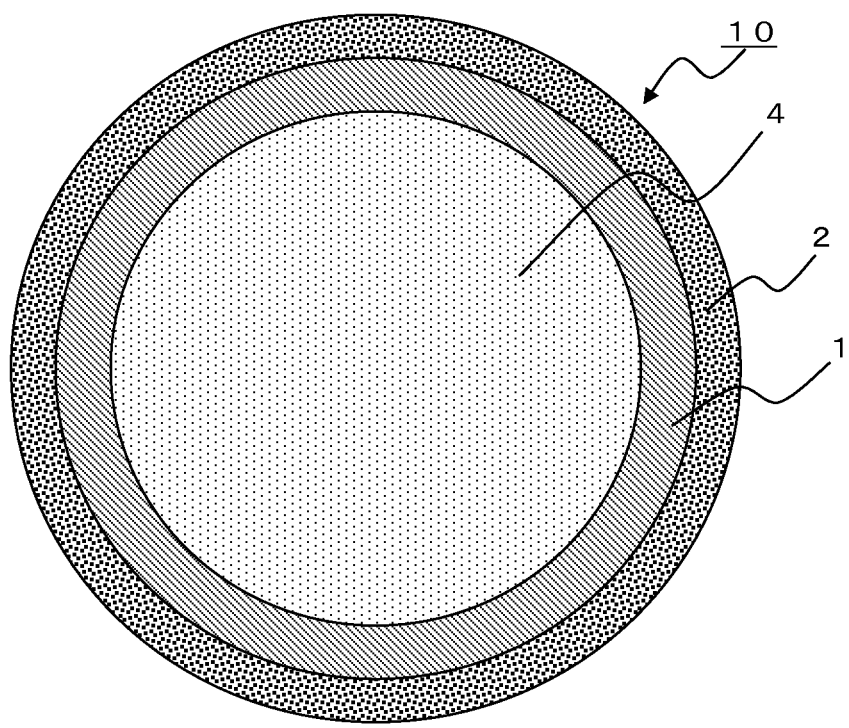
FIG. 4 is a planar view of the dicing sheet with the protective film forming layer of FIG. 2.

As shown in FIG. 1 to 4, the dicing sheet with the protective film forming layer according to the present invention comprises the base film 1, the adhesive layer 2, and the protective film forming layer 4; and the adhesive layer is at least formed at the area surrounding the protective film forming layer in a planar view. Note that, FIG. 3 is a planar view of the dicing sheet with the protective film forming layer shown in FIG. 1; and FIG. 4 is a planar view of the dicing sheet with the protective film forming layer shown in FIG. 2.

Hereinafter, the present invention will be explained into detail including the best mode thereof.

As shown in FIG. 1, as for the preferable embodiment of the dicing sheet with the protective film forming layer 10 according to the present invention (hereinafter it may be referred as "the embodiment of FIG. 1"), the protective film forming layer 4 is formed on the adhesive layer 2 of the adhesive sheet 3 comprising the base film 1 and the adhesive layer 2; and the protective film forming layer 4 is formed at the inner peripheral part of the adhesive sheet 3, further the adhesive layer 2 is exposed at the outer peripheral part of the adhesive sheet 3. Further, it is adhered to the ring frame 5 by the adhesive layer 2 of the outer peripheral part of the adhesive sheet 3.

Also, as shown in FIG. 2, other preferable embodiment of the dicing sheet with the protective film forming layer 10 according to the present invention (hereinafter, it may be referred as "the embodiment of FIG. 2") comprises the base film 1, the protective film forming layer 4 formed at the inner peripheral part of the base film 1, and the adhesive layer 2 formed at the outer peripheral part of the base film 1. Further, it is adhered to the ring frame 5 via the adhesive layer 2 at the outer peripheral part of the base film 1.

(The Base Film)

The base film of the present invention has a heat resistance, and specifically it has the following characteristics (a) to (c).

(a) The melting point of the base film is higher than 130° C., or has no melting point;

(b) the thermal shrinkage ratio under the heating at 130° C. for 2 hours is −5 to +5%; and (c) the rupture elongation of MD direction and CD direction of the base film is 100% or more, and the stress at 25% elongation of the base film is 100 MPa or less.

If the melting point of the base film is 130° C. or less, or if the thermal shrinkage ratio is out of the above mentioned range, the base film melts when curing the protective film forming layer, and it may become difficult to maintain the shape of the base film. Also, the base film may fuse with the surrounding device during the step of producing the semiconductor chip. The thermal shrinkage ratio is an indicator showing the tendency of the thermal deformation of the base film. If the dicing sheet with the protective film forming layer is constituted from the base film having the thermal shrinkage ratio of below −5% and higher than +5%, and when the wafer is held for heat curing, then due to the weight of the wafer, the peripheral part which does not correspond to the wafer (the base film of the outer peripheral part of the adhesive sheet in the embodiment of FIG. 1, and the outer peripheral part of the base film in the embodiment of FIG. 2) does not shrink but it rather expands, and a sagging may be easily caused in the dicing sheet with the protective film forming layer. Thereby, the dicing step after that may become difficult, or it may become difficult to pick up the chip which is after the dicing from the dicing sheet with the protective film forming layer.

Also, in either of MD direction of the base film (the direction along the direction of carrying the film when the film is made in a belt shape), and CD direction of the base film (the direction perpendicular to the MD direction on the same face of the film), the rupture elongation of the tensile test is 100% or more, and the stress at 25% of the base film is 100 MPa or less. If the rupture elongation is less than 100%, or the stress at 25% elongation exceeds 100 MPa, the expanding property of the dicing sheet with the protective film forming layer is deteriorated, it may cause the pickup malfunction or the breakage of the chip due to the contact between the adjacent chips during the pickup.

The melting point of the base film is preferably 140° C. or higher or has no melting point; and more preferably the melting point is 200° C. or higher or has no melting point. Also, the thermal shrinkage ratio of the base film under the heating at 130° C. for 2 hours is preferably −4% to +4%. By having the melting point and the thermal shrinkage ratio of the base film within the above range, the base film has excellent heat resistance, and the shape holding property of the base film when the above mentioned protective film forming layer is cured is maintained in a good condition. The thermal shrinkage ratio of the base film under the heating at 130° C. for 2 hours can be obtained by the following formula using the area of the base film which is before and after the introduction of the base film into 130° C. environment.

The thermal shrinkage ratio (%)={(the area of the base film before the introduction)−(the area of the base film after introduction)}/the area of the base film before introduction×100

Also, the rupture elasticity of MD direction and CD direction of the base film is preferably 120% or higher, and more preferably 250% or higher. The stress at 25% of the base film is preferably 80 MPa or less, and more preferably 70 MPa or less. By having the rupture elongation and the stress at 25% elongation within the above mentioned range, it shows good expanding property, and also the pickup malfunction or the chip breakage can be suppressed which are caused by the contact between the adjacent chips during the pickup.

As the base film, for example, polypropylene film, polybutylene terephthalate film, acrylic resin film, a heat resistance polyurethane film or so may be mentioned. Also, a crosslinking film or the film modified by a radiation electric discharge and so on may be used as well. The base film may be a multilayered body of the above mentioned films as long as it satisfies the above mentioned physical properties.

The thickness of the base film is not particularly limited, and preferably it is 30 to 300 μm, and more preferably 50 to 200 μm. By having the thickness of the base film within said range, it exhibits sufficient expanding property even after the cutting during the dicing. Also, since the dicing sheet with the protective film forming layer has sufficient flexibility, it exhibits excellent adherence against the workpiece (for example, the semiconductor wafer or so).

In case the dicing sheet with the protective film forming layer according to the embodiment of FIG. 2, the protective film forming layer is adhered to the workpiece (for example, the semiconductor wafer or so), and after necessary processing id done to the workpiece, the protective film forming layer is released from the base film while being adhered to the workpiece. That is, the dicing sheet with the protective film forming layer according to the embodiment of FIG. 2 is used for the process including the steps of transferring the protective film forming layer to the workpiece from the base film. Therefore, the surface tension of the face contacting the protective film forming layer of the base film is preferably 40 mN/m or less, more preferably 37 mN/m or less, and particularly preferably 35 mN/m or less. The lower limit is usually 25 mN/m or so. The base film with such low surface tension can be obtained by suitably selecting the material of the resin film, or by carrying out the release treatment by coating the release agent to the surface of the resin film. In case of carrying out the release treatment to the base film of the present invention, specifically, the release treatment is carried out to the inner peripheral part (the face forming the protective film forming layer) of the base film or to the entire face of the base film.

As the release agent used for the release treatment, an alkyd based, a silicone based, a fluorine based, an unsaturated polyester based, a polyolefin based, a waxed based or so may be used; and the alkyd based, the silicone based, and the fluorine based release agent are preferably as these have heat resistance.

In order to carry out the release treatment to the surface of the base film using the above mentioned release agent, the release agent may be without the solvent, or by diluting with the solvent or emulsifying and coated by a gravure coater, a Meyer bar coater, an air knife coater, a roll coater or so; then the release agent layer may be formed by curing by placing the based coated with the release agent under the ambient temperature or under a heating condition, or applying the electron beam.

Also, the surface tension of the base film may be regulated by stacking the films using a wet lamination or dry lamination, a thermofusion lamination, a melt extrusion lamination, and a coextrusion processing or so. That is, the base film may be made by producing the multilayered body stacking other films so that the film of which the surface tension of at least one face of the base film is within the above mentioned preferable range as the surface tension of the face contacting with the protective film forming layer of the base film becomes the face contacting the protective film forming layer.

Also, in case of using the polyolefin based film such as polypropylene film or so as the base film, depending on the property of the film, it may be possible to release the protective film forming layer from the base film without carrying out the release treatment. In such case, the base film without the release treatment may be used.

Also, in case the dicing sheet with the protective film forming layer according to the embodiment of FIG. 2, the total light transmittance rate of the base film at the wave length of 532 nm and the wave length of 1064 nm is preferably 70% or higher, and more preferably 75% or higher. By having the total light transmittance rate of the base film at the wave length of 532 nm and the wave length of 1064 nm within the above mentioned range, the laser marking can be done over the base film after the dicing sheet with the protective film forming layer is adhered to the semiconductor wafer.

Plurality of fine through holes may be provided to the base film of the area where the protective film forming layer is formed. By providing the through hole, the generation of the foreign matter can be suppressed which is caused by the gas generated during the laser marking to the protective film forming layer.

(The Adhesive Layer)

The adhesive layer of the present invention can be obtained by various known adhesives. As such adhesive agent, it is not particularly limited, and for example, the adhesives agent of a rubber based, an acrylic based, a silicone based, polyvinylether or so can be used. Also, the adhesive agent of the energy ray curable type or heat foaming type, and water swelling type can be used as well. As the energy ray curable (the ultraviolet ray curable, the electron beam curable) adhesive agent, it is particularly preferable to use the ultraviolet ray curable adhesive agent.

The adhesive agent layer is adhered to the ring frame at the outer peripheral part thereof when producing the chip which will be described in the following. When the curing of the protective film forming layer is carried out by adhering the peripheral part of the adhesive layer to the ring frame, the adhesives may remain on the ring frame when the ring frame is released from the adhesive layer. Also, during the curing step of the protective film forming layer, the adhesive layer may soften by being exposed under a high temperature, and the adhesive agent tends to remain easy. Therefore, among the above mentioned adhesive agent, from the point of preventing the adhesive agent from remaining on the ring frame, and to provide a heat resistance to the adhesive layer, the adhesive agent of acrylic based and the silicone based are preferable. Also, in case of carrying out the release treatment using the release agent of the silicone based to the entire face of the base film of the dicing sheet with the protective film forming layer according to the embodiment of FIG. 2, from the point of the adhesiveness between the base film and the adhesive layer, the silicone based adhesive agent is preferably used. Note that, the adhesive layer of the dicing sheet with the protective film forming layer is formed at the outer peripheral part of the base film.

Also, the adhesive force (the adhesive force to the SUS board after the heating under 130° C. for 2 hours after being adhered) of the adhesive layer of the part adhered to the ring frame (the outer peripheral part of the adhesive sheet in the dicing sheet with the protective film forming layer according to the embodiment of FIG. 1) is preferably 15 N/25 mm or less, more preferably 10 N/25 mm or less, and particularly preferably 5 N/25 mm or less. By having the adhesive force of the adhesive layer of the part adhered to the ring frame within the above mentioned range, an excellent adhesiveness to the ring frame can be exhibited, and the adhesive agent is prevented from remaining on the ring frame.

The thickness of the adhesive layer is not particularly limited, however preferably it is 1 to 100 μm, more preferably 2 to 80 μm, and particularly preferably 3 to 50 μm.

Also, the adhesive layer of the dicing sheet with the protective film forming layer according to the embodiment of FIG. 2 may be a both sided tape wherein the adhesive layer is provided at the both sides of the core material film. The both sided tape has a constitution of the adhesive layer/the core material film/the adhesive layer, and the adhesive layer of the both sided tape is not particularly limited, and the above mentioned adhesive agent can be used. In such case, as the adhesive layer positioned closest to the base film, the silicone based adhesive agent is preferably used from the point of the adhesiveness between the base film and the adhesive layer. Also, the core material film preferably has the heat resistance; and as the core material film, the film having the melting point of 120° C. or higher is preferably used. If the film having the melting point of less than 120° C. is used as the core material film, the core material film may melt and become unable to maintain the shape, or it may fuse with surrounding device during the heat curing of the protective film forming layer. As for the core material film, for example, polyester film, polypropylene film, polycarbonate film, polyimide film, fluorine resin film, liquid crystal polymer film or so are preferable.

(The Adhesive Sheet)

The adhesive sheet with the protective film forming layer according to the embodiment of FIG. 1 is obtained by providing the adhesive layer on the base film. The method of providing the adhesive layer on the base film surface may be a method of transferring the adhesive layer, which is formed by coating on the release sheet in a predetermined film thickness, to the base film; or it may be a method of forming the adhesive layer by directly coating the adhesive composition constituting the adhesive layer to the base film surface. As for the release sheet, those which are as same as the one provided on the protective film forming layer which will be described in the following can be used.

As the adhesive sheet obtained by providing the adhesive layer on the base film, the base film has the heat resistance. Also, the base film has a predetermined tension characteristic, thus the expanding can be carried out easily.

The total light transmittance rate of the adhesive sheet at the wave length of 532 nm and the wave length of 1064 nm is preferably 70% or higher, and more preferably 75% or higher. By having the total light transmittance rate of the adhesive sheet at the wave length of 532 nm and the wave length of 1064 nm within the above mentioned range, the laser marking can be done over the adhesive sheet (the base film and the adhesive layer) after the dicing sheet with the protective film forming layer is adhered to the semiconductor wafer.

At the adhesive sheet, plurality of fine through holes may be provided to the area where the protective film forming layer is provided. By providing the through hole, the generation of the foreign matter can be suppressed which is caused by the gas generated during the laser marking to the protective film forming layer.

(The Protective Film Forming Layer)

The protective film forming layer of the present invention is not particularly limited, and for example, the protective film forming layer of the heat curing type, the thermoplastic type, and the energy ray curable type can be used. Among these, the protective film forming layer of the heat curing type is preferable, since the above mentioned base film of the present invention has the heat resistance, and that the effect of suppressing the deformation during the heat curing can be preferably exhibited.

The protective film forming layer preferably comprises the binder polymer component (A) and the curable component (B).

(A) The Binder Polymer Component

In order to provide a sufficient adhesiveness and the film forming property to the protective film forming layer, the binder polymer component (A) is used. As the binder polymer component (A), the conventionally known acrylic polymer, polyester resin, urethane resin, acrylic urethane resin, silicone resin, and the rubber based polymer or so can be used.

The weight average molecular weight (Mw) of the binder polymer component (A) is preferably 10000 to 2000000, and more preferably 100000 to 1200000. If the weight average molecular weight of the binder polymer component (A) is too low, the adhesive force between the protective film forming layer and the adhesive sheet or the base film becomes too high, and the transfer problem of the protective film forming layer may be caused; and if the weight average molecular weight is too high, then the adhesiveness of the protective film forming layer declines, and the chip may not be able to be transferred, or the protective film may fall off from the chip or so after the transferring.

As the binder polymer component (A), acrylic polymer is preferably used. The glass transition temperature (Tg) of the acrylic polymer is preferably −60 to 50° C., more preferably −50 to 40° C., and particularly preferably −40 to 30° C. If the glass transition temperature of the acrylic polymer is too low, the adhesive force between the protective film forming layer and the adhesive sheet or the base film becomes large, thus there may be a transfer malfunction of the protective film forming layer. If the glass transition temperature is too high, the adhesiveness of the protective film forming layer declines, and the chip or so may not be transferred, or the protective film may be released from the chip or so after the transferring.

As the monomer constituting the above mentioned acrylic polymer, (meth)acrylate monomer or the derivative thereof may be mentioned. For example, alkyl (meth)acrylate having carbon atoms of the alkyl group of 1 to 18, specifically, methyl (meth)acrylate, ethyl (meth)acrylate, propyl (meth)acrylate, butyl (meth)acrylate, 2-ethylhexyl (meth)acrylate or so may be mentioned. Also, (meth)acrylate having a cyclic backbone, specifically cyclohexyl (meth)acrylate, benzyl (meth)acrylate, isobornyl (meth)acrylate, dicyclopentanyl (meth)acrylate, dicyclopentenyl (meth)acrylate, diclyopentenyloxyethyl (meth)acrylate, imide (meth)acrylate or so may be mentioned. Further, as the monomer comprising the functional group, hydroxymethyl (meth) acrylate, 2-hydroxyethyl (meth)acrylate, 2-hydroxypropyl (meth)acrylate or so which have hydroxyl group are mentioned; and glycidyl (meth)acrylate having epoxy group or so may be mentioned. As the acrylic polymer, the acrylic polymer comprising the monomer with the hydroxyl group is preferable since it has good compatibility with the curable component (B) which will be discussed in the following. Also, the above mentioned acrylic polymer may be copolymerized with acrylic acid, methacrylic acid, itaconic acid, vinyl acetate, acrylonitrile, styrene or so.

Further, as the binder polymer component (A), the thermoplastic resin may be blended in order to maintain the flexibility of the protective film after the curing. As such thermoplastic resin, those with the weight average molecular weight of 1000 to 100000 is preferable, and more preferably it is 3000 to 80000. The glass transition temperature of the thermoplastic resin is preferably −30 to 120° C., and more preferably −20 to 120° C. As the thermoplastic resin, polyester resin, urethane resin, phenoxy resin, polybutene, polybutadiene, polystyrene or so may be mentioned. These thermoplastic resins can be used alone or by combining two or more thereof. By comprising the above mentioned thermoplastic resin, the protective film forming layer follows the face where the protective film forming layer has transferred, and the void or so can be suppressed from occurring.

(B) The Curable Component

As the curable component (B), the heat curable component and/or the energy ray curable component are used.

As the heat curable component, the heat curing resin and heat curing agent are used. As the heat curing resin, for example the epoxy resin is preferable.

As the epoxy resin, the conventionally known epoxy resin can be used. As the epoxy resin, specifically, epoxy compound having two or more functional group in the molecule such as polyfunctional epoxy resin, bisphenyl compound, bisphenol A diglycidylether and the hydrogenated product thereof, orthocresol novolak epoxy resin, dicyclopentadiene type epoxy resin, biphenyl type epoxy resin, bisphenol A type epoxy resin, bisphenol F type epoxy resin, phenylene backbone type epoxy resin or so may be mentioned. These may be used alone or by combining two or more thereof.

In the protective film forming layer, preferably 1 to 1000 parts by weight, more preferably 10 to 500 parts by weight, and particularly preferably 20 to 200 parts by weight of the heat curing resin is included with respect to 100 parts by weight of the binder polymer component (A). If the content of the heat curing resin is less than 1 parts by weight, sufficient adhesiveness may not be obtained, and if it exceeds 1000 parts by weight, the release force between the protective film forming layer and the adhesive sheet or the base film increases, and transfer malfunction of the protective film forming layer may occur.

The heat curing agent functions as the curing agent against the heat curing resin, particularly against the epoxy resin. As preferable heat curing agent, the compound having, two or more functional groups capable of reacting with the epoxy group in one molecule may be mentioned. As such functional group, phenolic hydroxyl group, alcoholic hydroxyl group, amino group, carboxyl group, acid anhydride or so may be mentioned. Among these, preferably phenolic hydroxyl group, amino group, acid anhydride or so may be mentioned, and further preferably phenolic hydroxyl group and amino group may be mentioned.

As specific examples of the phenol based curing agent, polyfunctional phenol resin, biphenol, novolac phenol resin, dicyclopentadiene phenol resin, XYLOK phenol resin, aralkyl phenol resin or so may be mentioned. As for specific examples of amine curing agent, DICY (dicyandiamide) may be mentioned. These may be used alone or by mixing two or more thereof.

The content of the heat curing agent is preferably 0.1 to 500 parts by weight, and more preferably 1 to 200 parts by weight with respect to 100 parts by weight of the heat curing component. If the content of the heat curing agent is too little, the bonding property may not be obtained due to the insufficient curing, on the other hand if it is too much, then the moisture absorbing rate of the protective film forming layer increases and lowers the reliability of the semiconductor device.

When the protective film forming layer has the heat curable component as the curable component (B), the protective film forming layer is heat curable type. In such case, the protective film forming layer can be cured by applying the heat, but the dicing sheet with the protective film forming layer of the present invention comprises the base film with a heat resistance, thus the base film barely causes problem due to the deformation of the base film during the heat curing of the protective film forming layer.

As the energy ray curable component, the energy ray polymerizable group is included, and the low molecular weight compound (energy ray polymerizable compound) which polymerize cure when the energy ray such as ultraviolet ray and the electron beam or so are irradiated can be used. As such energy ray curable component, specifically an acrylate compound such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate oligomer, epoxy modified acrylate, polyetheracrylate and itaconic acid oligomer or so may be mentioned. Such compounds comprise at least one polymerizable double bond in the molecule, and usually the weight average molecular weight is 100 to 30000, preferably 300 to 10000 or so. The blending amount of the energy ray polymerizable compound is preferably 1 to 1500 parts by weight, more preferably 10 to 500 parts by weight, and particularly preferably 20 to 200 parts by weight with respect to 100 parts by weight of binder polymer component (A).

Also, as the energy ray curable component, the energy ray curable polymer wherein an energy ray polymerizable group is bonded to a main chain or a side chain of the binder polymer component (A) may be used. Such energy ray curable polymer has a function as the binder polymer component (A) and the function as the curable component (B).

The main backbone of the energy ray curable polymer is not particularly limited, and it may be acrylic polymer which is widely used as the binder polymer component (A). Also, it may be polyester, polyether or so, however it is preferable to have the acrylic polymer as the main backbone since it is easy to control the synthesis and the physical properties.

The energy ray curable polymer group bonded to the main chain or the side chain of the energy ray curable polymer is, for example, a group including energy ray curable carbon-carbon double bond; and specifically (meth)acryloyl group or so may be mentioned as an example. The energy ray polymerizable group may be bonded to the energy ray curable polymer via alkylene group, alkyleneoxy group, polyalkyleneoxy group.

The weight average molecular weight (Mw) of the energy ray curable polymer bonded with the energy ray polymerizable group is preferably 10000 to 2000000, more preferably 100000 to 1500000. Also, the glass transition temperature (Tg) of the energy ray curable polymer is preferably −60 to 50° C., more preferably −50 to 40° C., and particularly preferably −40 to 30° C.

The energy ray curable polymer is obtained by reacting acrylic polymer having the functional group such as hydroxyl group, carboxyl group, amino group, substituted amino group, epoxy group or so, with the polymerizable group containing compound comprising the substituent group reacting with said functional group and 1 to 5 of the energy ray polymerizable carbon-carbon double bonds in one molecule. As the substituent group reacting with said functional group, isocyanate group, glycidyl group, carboxyl group or so may be mentioned.

As for the polymerizable group containing compound, (meth)acryloyloxyethyl isocyanate, metha-isopropenyl-α, α dimethylbenzyl isocyanate, (meth)acryloyl isocyanate, allyl isocyanate, glycidyl (meth)acrylate; (meth)acrylic acid or so may be mentioned.

The acrylic polymer is preferably a copolymer between (meth)acrylic monomer having the functional group of hydroxyl group, carboxyl group, amino group, substituted amino group, epoxy group and the like or the derivative thereof, with other (meth)acrylate monomer or the derivative thereof which is copolymerizable with said monomer.

As (meth)acrylic monomer having the functional group of hydroxyl group, carboxyl group, amino group, substituted amino group, epoxy group and the like or the derivative thereof, for example, 2-hydroxyethyl(meth)acrylate, 2-hydroxypropyl(meth)acrylate which has the hydroxyl group; acrylic acid, methacrylic acid, itaconic acid which has carboxyl group; glycidylmethacrylate, glycidyl acrylate which has epoxy group or so may be mentioned.

As other (meth)acrylate monomer or the derivative thereof copolymerizable with the above mentioned monomer, alkyl (meth)acrylate having carbon atoms of the alkyl group of 1 to 18, specifically, methyl (meth)acrylate, ethyl (meth)acrylate, propyl (meth)acrylate, butyl (meth)acrylate, 2-ethylhexyl (meth)acrylate or so; and as (meth)acrylate having a cyclic backbone, specifically cyclohexyl (meth) acrylate, benzyl (meth)acrylate, isobornyl acrylate, dicyclopentanyl (meth)acrylate, dicyclopentenyl (meth)acrylate, diclyopentenyloxyethyl (meth)acrylate, imide acrylate or so may be mentioned. Also, in above mentioned acrylic polymer, vinyl acetate, acrylonitrile, styrene or so may be copolymerized.

In case of using the energy ray curable polymer, said energy ray polymerizable compound may be used together, and also the binder polymer component (A) may be used together. The relation of the blending amount of these three in the protective film forming layer of the present invention is preferably 1 to 1500 parts by weight, more preferably 10 to 500 parts by weight, and particularly preferably 20 to 200 parts by weight of the energy ray polymerizable compound with respect to 100 parts by weight of the sum of the energy ray curable polymer and the binder polymer component (A).

By providing the energy ray curable property to the protective film forming layer, the protective film forming layer can be cured easily in a short time, and the production efficiency of the chip with the protective film is improved. Conventionally, the protective film for the chip was generally formed by the heat curing resin such as epoxy resin or so; however the curing temperature of the heat curing resin was over 200° C., and it required about 2 hours to cure, hence it was an obstacle for improving the production efficiency. However, the energy ray curable protective film forming layer is capable of curing in a short time by energy ray irradiation, hence the protective film can be formed easily, which contributes to improve the production efficiency.

Other Components

The protective film forming layer may include the following components in addition to the above mentioned binder polymer component (A) and the curable component (B).

(C) The Coloring Agent

The protective film forming layer preferably comprises the coloring agent (C). By blending the coloring agent in the protective film forming layer, when the semiconductor devices are incorporated to the machines, the infrared ray or so generated by the surrounding devices can be blocked, thus the malfunction of the semiconductor device caused thereby can be prevented; and also the visibility of the characters of printed on the product number or so to the protective film obtained by curing the protective film forming layer is improved. That is, for the semiconductor device or the semiconductor chip formed with the protective film, usually the product number is printed on the surface of the protective film by laser marking method (the method of printing by grinding the surface of the protective film by the laser light), however as the protective film comprising the coloring agent (C), the sufficient contrast between the area of the protective film which is ground off by the laser, and those not ground off can be obtained, hence the visibility is improved. As the coloring agent (C), the organic or inorganic pigment and die are used. Among these, a black pigment is preferable from the point of the blocking property of the electromagnetic wave or the infrared ray. As for the black pigment, carbon black, iron oxide, manganese dioxide, aniline black, and activated carbon or so may be used, but it is not limited thereto. The carbon black is particularly preferable from the point of improving the reliability of the semiconductor device. The coloring agent (C) may be used alone, or by combining two or more thereof. The high curing property of the protective film of the present invention is particularly preferably exhibited when the ultraviolet ray transmittance rate has declined by using the coloring agent which reduces the transmittance of both of visible light and/or the infrared ray and the ultraviolet ray. As the coloring agent which reduces both of visible light and/or the infrared ray and the ultraviolet ray, besides the above mentioned black pigment, it is not particularly limited as long as it has an absorbency or a reflectivity at both of the wave length range of visible light and/or the infrared ray and the ultraviolet ray.

The blending amount of the coloring agent (C) is preferably 0.1 to 35 parts by weight, more preferably 0.5 to 25 parts by weight, and most preferably 1 to 15 parts by weight with respect to 100 parts by weight of entire solid portion constituting the protective film forming layer.

(D) The Heat Curing Catalyst

The heat curing catalyst (D) is used to control the curing speed of the protective film forming layer. The heat curing catalyst (D) is preferably used in case the epoxy resin and the heat curing agent are used together in the curable component (B).

As the preferable heat curing catalyst, a tertiary amines such as triethylene diamine, benzyldimethyl amine, triethanol amine, dimethylamino ethanol, tris(dimethylaminomethyl) phenol or so; imidazols such as 2-methylimidazol, 2-phenylimidazol, 2-phenyl-4-methylimidazol, 2-phenyl-4, 5-dihydroxymethylimidazol, 2-phenyl-4-methyl-5-hydroxymethylimidazol or so; organic phosphine such as tributylphosphine, diphenylphosphine, triphenylphosine or so;

tetraphenylboron salt such as tetraphenylphosphoniumtetraphenylborate, triphenylphosphinetetraphenylborate or so may be mentioned. These may be used alone or by mixing two or more thereof.

The heat curing catalyst (D) is included preferably within the range of preferably 0.01 to 10 parts by weight, more preferably 0.1 to 1 parts by weight, with respect to 100 parts by weight of curable component (B). By comprising the heat curing catalyst in the amount described in above range, it has excellent adhesive characteristic even if it is exposed under the high temperature high humidified condition, and also even if it is exposed to a harsh reflow condition, a high reliability can be still attained. If the content of the heat curing catalyst (D) is too little, a sufficient adhesive characteristic may not be obtained due to the insufficient curing, and if it is too much, then the heat curing catalyst having high polarity moves to the bonding boundary side in the protective film forming layer under a high temperature high humidified condition, and the reliability of the semiconductor device declines due to the segregation.

(E) The Coupling Agent

The coupling agent (E) may be used in order to improve the adhesiveness and the attachment property of the protective film forming layer against the chip, and/or the aggregation property of the protective film. Also, by using the coupling agent (E), without compromising the heat resistance of the protective film obtained by curing the protective film forming layer, the water resistance thereof can be improved.

As for the coupling agent (E), the compound comprising the group capable of reacting with the functional group comprised in the binder polymer component (A), and curable component (B) is preferably used. As for the coupling agent (E), silane coupling agent is preferable. As for such coupling agent, γ-glycidoxypropyltrimethoxy silane, γ-glycidoxypropylmethyldiethoxy silane, β-(3,4-epoxycyclohexyl)ethyltrimethoxy silane, γ-(methacryloxypropyl)trimethoxy silane, γ-aminopropyltrimethoxy silane, N-6-(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidepropyltriethoxy silane, γ-melcaptopropyltrimethoxy silane, γ-melcaptopropylmethyldimethoxy silane, bis(3-triethoxysilylpropyl)tetrasulphone, methyltrimethoxy silane, methyltriethoxy silane, vinyltrimethoxy silane, vinyltriacetoxy silane, imidazol silane or so may be mentioned. These may be used alone or by mixing two or more thereof.

The coupling agent (E) is included preferably by proportion of usually 0.1 to 20 parts by weight, preferably 0.2 to 10 parts by weight, and more preferably 0.3 to 5 parts by weight with respect to 100 parts by weight of the total of the binder polymer component (A) and the curable component (B). If the content of the coupling agent (E) is less than 0.1 parts by weight, there is a chance that the above mentioned effect cannot be obtained, and if it exceeds 20 parts by weight, it may become a cause of generating the outgas.

(F) The Inorganic Filler

By blending the inorganic filler (F) in the protective film forming layer, it becomes possible to control the heat expansion coefficient at after the curing, thus the heat expansion coefficient of the protective film after the curing is optimized with respect to the semiconductor chip; thereby the reliability of the semiconductor device can be improved. Also, the moisture absorbing rate of the protective film after the curing can be reduced as well.

As the preferable inorganic filler, powders such as silica, alumina, talc, calcium carbonate, titanium oxide, iron oxide, silicon carbide, boron nitride or so, a beads of which these has been made into spherical form, a single crystal fiber and glass fiber or so may be mentioned. Among these, silica filler and alumina filler are preferable. The above mentioned inorganic filler (F) may be used alone or by mixing two or more thereof. The content of the inorganic filler (F) is adjustable within the range of usually 1 to 80 parts by weight with respect to 100 parts by weight of the entire solid portion constituting protective film forming layer.

(G) The Photopolymerization Initiator

In case the protective film forming layer comprises the energy ray curable component as the aforementioned curable component (B), upon using, the energy ray such as ultra violet ray or so is irradiated to cure the energy ray curable component. At this time, by comprising the photopolymerization initiator (G) in said composition, the time for polymerizing and curing, and also the photo irradiation amount can be reduced.

As specific examples of such photopolymerization initiator (G), benzophenone, acetophenone, benzoin, benzoinmethylether, benzoinethylether, benzoinisopropylether, benoinisobutylether, bennzoin benzoic acid, benzoin methyl benzoic acid, benzoindimethylketal, 2,4-diethylthioxanthone, α-hydroxycyclohexylphenylketone, benzyldiphenylsulphide, tetramethylthiurammonosulphide, azobisisobutyronitrile, benzil, dibenzil, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloranthraquinone or so may be mentioned. The photopolymerization initiator (G) may be used alone or by combining two or more thereof.

The blending amount of the photopolymerization initiator (G) is preferably 0.1 to 10 parts by weight, and more preferably 1 to 5 parts by weight with respect to 100 parts by weight of energy ray polymerizable component. If it is less than 0.1 parts by weight, a sufficient transferring property may not be obtained due to the insufficient photo-polymerization, and if it exceeds 10 parts by weight, the residues which do not contribute the photo-polymerization remains and the curing property of the protective film forming layer may be insufficient.

(H) the Crosslinking Agent

The crosslinking agent may be added in order to control the initial bonding force and the aggregation force of the protective film forming layer. As for the crosslinking agent (H), organic polyvalent isocyanate compound, organic polyvalent imine compound or so may be mentioned.

As for the above mentioned organic polyvalent isocyanate compound, aromatic polyvalent isocyanate compound, aliphatic polyvalent isocyanate compound, alicyclic polyvalent isocyanate compound and the trimer of the organic polyvalent isocyanate compound thereof, and terminal isocyanateurethane pre-polymer obtained by reacting these organic polyvalent isocyanate compounds and the polyol, may be mentioned.

As for the organic polyvalent isocyanate compound for example, 2,4-tolylenediisocyanate, 2,6-tolylenediisocyanate, 1,3-xylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2-4'-diisocyanate, trimethylolpropane adduct tolylenediisocyanate, and lysine isocyanate or so may be mentioned.

As for the above mentioned organic polyvalent imine compounds, N—N'-diphenylmethane-4,4'-bis(1-aziridinecarboxyamide), trimethylolpopane-tri-β-aziridinylpropionate, tetramethylolmethane-tri-β-aziridinylpropionate, and N,N'-toluene-2,4-bis(1-aziridinecarboxyamide)triethylenemelamine or so may be mentioned.

The crosslinking agent (H) is used in the ratio of usually 0.01 to 20 parts by weight, preferably 0.1 to 10 parts by weight, and more preferably 0.5 to 5 parts by weight with respect to total amount of 100 parts by weight of the binder polymer component (A) and the energy ray curable polymer.

(I) General Additives

Various additives may be blended depending on the needs into the protective film forming layer besides the above described. As for the various additives, a leveling agent, a plasticizer, an antistatic agent, an antioxidizer, an ion scavenger, a gettering agent, a chain transfer agent or so may be mentioned.

The protective film forming layer formed from each component as described in the above has the bonding property and the curable property, and at the non-cured condition, it is easily bonded to the workpiece (the semiconductor wafer or chip or so) by pressing. When pressing, the protective film forming layer may be applied with heat. By going through the curing, at the end, a protective film having high impact resistance can be provided, and having excellent bonding strength, further sufficient protection function can be maintained even under the harsh high temperature and high humidified condition. Note that, the protective film forming layer can be a single layer structure, or it may be multilayer structure only if one or more layer having above mentioned component is included.

The thickness of the protective film forming layer is not particularly limited, however it is preferably 3 to 300 μm, more preferably 5 to 250 μm, and particularly preferably 7 to 200 μm.

The maximum transmittance rate at the wave length of 300 to 1200 nm, which is the scale to indicate the transmittance of the visible light and/or the infrared ray and the ultraviolet ray of the protective film forming layer, is preferably 20% or less, more preferably 0 to 15%, even more preferably more than 0% and 10% or less, and particularly preferably 0.001 to 8%. By having the maximum transmittance rate of the protective film forming layer at the wave length of 300 to 1200 nm within the above mentioned range, the protective film forming layer has excellent curability in case the protective film forming layer comprises the energy ray curable component (particularly the ultraviolet ray curable component). Also, the effects of reducing the transmittance at the visible light wave length and/or the infrared ray range, the prevention of the malfunction caused by the infrared ray of the semiconductor wafer, and the improvements of visibility of the printings can be obtained. The maximum transmittance rate of the protective film forming layer at the wavelength of 300 to 1200 nm can be regulated by the above mentioned coloring agent (C). Note that, the maximum transmittance rate of the protective film forming layer is determined by measuring the total light transmittance rate at the 300 to 1200 nm of the cured protective film forming layer (the thickness of 25 μm), using UV-vis spectroscopy (made by Shimadzu Corporation), then the highest value of the transmittance rate was determined as the maximum transmittance rate.

(The Release Sheet)

The release sheet may be provided to the dicing sheet with the protective film forming layer, until it is to be used, in order to avoid the contact of the surface of the protective film forming layer or the adhesive layer with the outside. As the release sheet, for example, a transparent film may be used such as, polyethylene film, polypyrene, film, polybutene film, polybutadiene film, polymethylpentene film, polyvinyl chloride film, vinyl chloride copolymer film, polyethylene telephthalate film, polyethylene naphthalate film, polybutylenetelephthalate film, polyurethane film, ethylene vinyl acetate copolymer film, ionomer resin film, ethylene (meth)acrylic acid copolymer film, ethylene (meth) acrylate copolymer film, polystyrene film, polycarbonate film, polyimide film, fluorine resin film or so. Also, the crosslinked film thereof may be used as well. Further, it may be a laminated film thereof. Also, a colored film thereof, non-transparent film or so can be used as well. Also, one side of the release sheet may be carried out with the release treatment. As for the release agent used for the release treatment, for example, the release agent of silicone based, fluorine based, long chain alkyl group containing carbamate or so may be mentioned.

In order to carry out the release treatment to the surface of the release sheet using the above mentioned release agent, the release agent is used without the solvent, or by diluting in the solvent or by emulsifying, and coating by gravure coater, Meyer bar coater, air knife coater, or roll coater or so, then the release sheet coated with the release agent is provided under room temperature applying the heat or by electron beam for curing to form the release layer. Also, the lamination of the film can be carried out by wet lamination or dried lamination, thermofusion lamination, melt extrusion lamination, coextrusion processing or so.

The thickness of the release sheet is usually 10 to 500 μm, preferably 15 to 300 μm, and particularly preferably 20 to 250 μm or so. Also, the thickness of the resin film forming layer is usually 1 to 500 μm, preferably 5 to 300 μm, and particularly preferably 10 to 150 μm or so.

(The Dicing Sheet with the Protective Film Forming Layer)

As the production method of the dicing sheet with the protective film forming layer, the production method of the dicing sheet with the protective film forming layer according to the embodiment of FIG. 1, the production method of the dicing sheet with the protective film forming layer according to the embodiment of FIG. 2 will be described in detail in this order.

As for the production method of the dicing sheet with the protective film forming layer according to the embodiment of FIG. 1, first, the protective film forming layer is formed on the release sheet. The protective film forming layer can be obtained by coating and drying the protecting film forming layer composition which is made by mixing the above mentioned components in an appropriate ratio in a suitable solvent, on the suitable release sheet. Also, the protective film forming layer composition can be coated and dried on the release sheet to form a film, then this is pasted against other release sheet, and it can be held between the two release sheets (release sheet/protective film forming layer/release sheet).

Next, in case it is held between the two release sheets, one of the release sheets is released. Then, the protective film forming layer is cutout to the same size as or a size larger than the workpiece (for example, the semiconductor wafer or so) to which the protective film forming layer is pasted; and the redundant part is removed from the area surrounding the protective film forming layer being cutout in a circle. Then, the circular protective film forming layer is pasted to the adhesive layer of the above mentioned adhesive sheet prepared separately, then it is cutout in a concentric circular shape along the outer diameter of the margin of the adhesives against the ring frame, and the surrounding area of the adhesive sheet being cutout is removed. Finally, the release sheet adhered to the protective film forming layer is released; thereby the dicing sheet with the protective film forming layer according to the embodiment of FIG. 1 of the present invention is obtained.

As shown in FIG. 1, in the dicing sheet with the protective film forming layer of the present invention, the protective film forming layer 4 is stacked in a releasable manner at the inner peripheral part of the adhesive sheet 3 consisting of the base film 1 and the adhesive layer 2, and the adhesive layer 2 is exposed at the outer peripheral part of the adhesive sheet 3. That is, the protective film forming layer 4 having smaller diameter than the adhesive sheet 3 is stacked in a releasable manner at a concentric circular shape on the adhesive layer 2 of the adhesive sheet 3.

Further, at the adhesive layer 2 exposed at the outer peripheral part of the adhesive sheet 3, the ring frame 5 is adhered.

Also, in case the adhesive layer is formed by the energy ray curable adhesive agent, by selecting the range irradiation the energy ray, the part in the adhesive layer with reduced adhesive force at the predetermined position, size and shape, and the part in the adhesive layer of which the adhesive force is not reduced can be formed. Therefore, the energy ray is irradiated to reduce the adhesive force of the part where the ring frame of the adhesive layer is adhered or the part where the protective film forming layer of the adhesive layer is formed, thereby it can be regulated to a desired range. As a result, the adhesive layer having excellent adhesive property, capable of preventing the adhesives remaining on the ring frame, and capable of easily transferring the adhesive layer to the protective film forming layer to the workpiece can be obtained. Such adhesive layer is obtained by the method of printing the protective mask on the base film partially blocking the energy ray, then pasting the blocking film, and forming by vapor deposition or spattering, followed by irradiating the energy ray from the base film side.

Also, on the margin of the adhesives (the adhesive layer exposed at the outer peripheral part of the adhesive sheet) of the ring frame, the both sided tape having a ring shape or the adhesive layer can be provided separately. The both sided tape has a constitution of the adhesive layer/the core material/the adhesive layer, and the adhesive layer of the both sided tape is not particularly limited, and the same adhesives suitable for aforementioned adhesive sheet 3 can be selected. Also, the core material, preferably have the heat resistance, and as the core material, the film having the melting point of 120° C. or higher is preferably used. If the film having the melting point less than 120° C. is used as the core material, the core material may melt and cannot maintain the shape when heat curing the protective film forming layer, which may cause to fuse with the surrounding devices. As the core material, for example, polyester film, polypropylene film, polycarbonate film, polyimide film, fluorine resin film, and the liquid crystal polymer film or so can be preferably used.

Also, the heat resistant resin layer may be provided between the adhesive layer and the protective film forming layer. By providing the heat resistant resin layer, the heat contraction of the dicing sheet with the protective film forming layer is further suppressed. Also, since the adhesive layer and the protective film forming layer are not directly in contact, when carrying out the heat curing of the protective film forming layer, the adhesive layer and the protective film forming layer can be prevented from fusing.

As for the heat resistant resin layer, it is not particularly limited as long as it is a material with the heat resistance, and anneal treated polyester film, polycarbonate film, polyphenylene sulfide film, cycloolefin resin film, polyimide resin film or so may be mentioned. The heat resistant resin layer is selected from the material which the protective film forming layer can be released easily, or it is preferably carried out with the surface treatment such as release treatment or so. As the release treatment, depending on the above mentioned case, the same release treatment of the release sheet provided on the protective film forming layer or so may be mentioned.

As for the production method of the dicing sheet with the protective film forming layer according to the embodiment of FIG. 2, first, the protective film forming layer is formed on the release sheet. The method of forming the protective film forming layer on the release sheet is as already discussed in the production method of the dicing sheet with the protective film forming layer according to the embodiment of FIG. 1 mentioned in above.

Next, in case the protective film forming layer is held between the two release sheets, one of the release sheets is released. Then, the protective film forming layer is cutout to the same size as or a size larger than the workpiece (for example, the semiconductor wafer or so) to which the protective film forming layer is adhered; and the redundant part is removed from the area surrounding the protective film forming layer being cutout in a circle. Then, the circular protective film forming layer is adhered to the above mentioned base film prepared separately, and other release sheet is released.

Next, the adhesive layer is prepared. The adhesive layer is usually carried out with a processing such as the punch out or so before being stack on the base film, hence on the both sides thereof, the release sheet carried out with the treatment using the silicone based release agent or so is stacked. The release sheet functions to protect and support the adhesive layer. If the release sheet stacked on the both side is constituted so that there is a difference between the release force such as easy release type tight release type, the performance during the forming of the dicing sheet with the protective film forming layer is improved hence it is preferable. That is, as the release sheet, the release sheet of easy release type and the release sheet of the tight release type is used to hold the adhesive layer in between, and the adhesive layer and the release sheet of the easy release type are cut out in a circular shape using the punching die from the release sheet side of the easy release type, then the redundant part is removed from the adhesive layer and the release sheet of the easy release type punched out in a circular shape to form the opening part. Next, the release sheet of the easy release type on the adhesive layer which surrounds the opening part is removed to expose the adhesive layer. Then, the base film stacked with the protective film forming layer obtained in the above and the exposed face of the adhesive layer are stacked so that the opening part being punched out in a circular shape and the circular protective film forming layer are in a concentric circular shape, thereby the multilayered body is made.

Then, the opening part and the protective film forming layer are cutout in a concentric circular shape along the outer diameter of the margin of the adhesives against the ring frame, thereby the surrounding area of the multilayered body being cutout is removed. Lastly, by releasing the release sheet of tight release type, the dicing sheet with the protective film forming layer according to the embodiment of FIG. 2 of the present invention is obtained.

As shown in FIG. 2, the dicing sheet with the protective film forming layer 10 of the present invention comprises the base film 1, the protective film forming layer 4 formed at the inner peripheral part of the base film 1, and the adhesive layer 2 formed at the outer peripheral part of the base film 1, and it is adhered to the ring frame 5 by the adhesive layer 2. The inner diameter of the ring shape adhesive layer 2 (the diameter of the opening part) formed at the outer peripheral part of the base film 1 is formed so that it is larger than the protective film forming layer 4. The width of the adhesive layer 2 formed in a ring shape is usually 0.5 to 20 mm, however depending on the shape and the width of the ring frame, and the strength of the adhesiveness of the adhesive layer and the ring frame, it can be controlled appropriately including the width outside of such range.

Also, the heat resistant resin layer may be provided between the base film and the protective film forming layer. By providing the heat resistant resin layer, the heat contraction of the dicing sheet with the protective film forming layer can be further suppressed.

As for the heat resistant resin layer, the same film as described as an example of the heat resistant resin layer of the dicing sheet with the protective film forming layer according to the embodiment of FIG. 1 can be used. The means for holding the heat resistant resin layer on the base film is not particularly limited, and for example, adhering by providing another adhesive layer between the heat resistant resin layer and the base film or so may be mentioned. The heat resistant resin layer is selected from the material which the protective film forming layer can be easily released, or the surface treatment such as the release treatment or so is preferably carried out. As the release treatment, depending on the above mentioned case, the same release treatment of the release sheet provided on the protective film forming layer or so may be mentioned.

(The Production Method of the Chip)

Next, the method of use of the dicing sheet with the protective film forming layer according to the present invention will be explained using the case of applying the sheet for the production of the chip (for example, the semiconductor chip or so).

The production method of the semiconductor chip using the dicing sheet with the protective film forming layer according to the embodiment of FIG. 1 of the present invention is carried out by adhering the protective film forming layer of the above mentioned sheet to the backside of the semiconductor wafer (workpiece) formed with the circuit on the surface, then carrying out the below steps (1) to (3) in any one of the order of [(1), (2), (3)], [(2), (1), (3)], or [(2), (3), (1)]; thereby the semiconductor chip having the protective film on the backside can be obtained.

step (1): obtaining a protective film by curing the protective film forming layer, step (2): dicing the semiconductor wafer (workpiece) and the protective film forming layer or the protective film, and step (3): releasing between the adhesive sheet and the protective film forming layer or the protective film.

Also, the production method of the semiconductor chip using the dicing sheet with the protective film forming layer according to the embodiment of FIG. 2 of the present invention is carried out by adhering the protective film forming layer of the above mentioned sheet on the backside of the semiconductor wafer (workpiece) formed with the circuit on the surface, then carrying out the below steps (1) to (3) in any one of the order of [(1), (2), (3)], [(2), (1), (3)], or [(2), (3), (1)]; thereby the semiconductor chip having the protective film on the backside can be obtained.

step (1): obtaining a protective film by curing the protective film forming layer, step (2): dicing the semiconductor wafer (workpiece) and the protective film forming layer or the protective film, and step (3): releasing between the base film and the protective film forming layer or the protective film.

Also, the production method of the semiconductor chip according to the present invention, other than the above mentioned steps (1) to (3), the following step (4) is further included, the step (4) can be carried out at any time after the above mentioned step (1).

Step (4): laser printing on the protective film.

The semiconductor wafer may be a silicon wafer, or it may be a compound semiconductor wafer such as galium.arsenic or so. The formation of the circuit to the wafer surface can be carried out by various methods including the method conventionally used such as etching method, liftoff method or so. Next, the opposite face (the backside) of the circuit surface of the semiconductor wafer is ground. The method of grinding is not particularly limited, and the known means using the grinder or so may be used for grinding. During the backside grinding, to the circuit face for protecting the circuit of the surface, the adhesive sheet called surface protection sheet is adhered. The backside grinding is carried out by fixing the circuit face side of the wafer (that is the surface protection sheet side) to the chuck table or so, then grinding the backside which is not formed with the circuit using the grinder. The thickness of the wafer after the grinding is not particularly limited, however, usually it is 20 to 500 μm or so. Then, depending on the needs, the fracture layer caused during the backside grinding is removed. The removal of the fracture layer is done by chemical etching, plasma etching or so.

Next, on the backside of the semiconductor wafer, the protective film forming layer of the above mentioned dicing sheet with the protective film forming layer is adhered. Then, the steps of (1) to (3) are carried out in an arbitrary order. The detail of this process is discussed in Japanese Patent Article Laid Open No. 2002-280329. As one example, in case of using the dicing sheet with the protective film forming layer according to the embodiment of FIG. 1 of the present invention, the example of carrying out the steps (1) to (3) in the order of [(1), (2), (3)] will be explained.

First, the protective film forming layer of the above mentioned dicing sheet with the protective film forming layer is adhered to the backside of the semiconductor wafer to which the circuit is formed on the surface. Next, the protective film forming layer is cured, and the protective film is formed on the entire face of the wafer. By adhering the protective film forming layer before the curing, the protective film forming layer nicely fits to the adhering face of the wafer, and the adhesiveness between the protective film and the semiconductor chip improves. In the protective film forming layer, the curable component (B) is included, thus generally, the protective film forming layer cures by heat curing or the energy ray irradiation. Note that, in case the heat curable component and the energy ray curable component are blended in the protective film forming layer, the curing of the protective film forming layer can be carried out by both of heating and energy ray irradiation; and the curing by heating and energy ray irradiation can be carried out simultaneously, or it may be carried out sequentially. As a result, the protective film made of curable resin is formed at the wafer backside, and compared to the case of wafer alone, the strength is improved; thus the breakage of the thinned wafer during the handling can be reduced. Also, compared to the coating method wherein the coating solution for the protective film is directly coated or made into film to the backside of the wafer or chip, the thickness of the protective film has excellent uniformity.

In case the protective film forming layer is heat curable, sagging of the dicing sheet with the protective film forming layer caused by the deformation during the heat curing is suppressed, and the effect that the dicing or the pickup of becoming easy is exhibited preferably. Therefore, it is preferable to use the dicing sheet with the protective film forming layer of the present invention to the production method wherein the protective film forming layer is heat curable, and dicing or pickup (the releasing of the adhesive sheet from the protective film) are carried out after the heat curing of the protective film forming layer, that is the dicing sheet with the protective film forming layer of the present invention is preferably used to the production method of carrying out the steps in the order of [(1), (2), (3)] or [(2), (1), (3)].

Note that, in case the steps are carried out in the order of [(2), (3), (1)], or in case the protective film forming layer does not have the heat curable property, there is no need to consider the deformation of the base film during the heat curing of the protective film forming layer, however before the step (3), if there is a step accompanying the heat applying, the effect of the dicing sheet with the protective film forming layer of the present invention which is to suppress the heat deformation of the base film is exhibited. For example, in case the adhesive agent having a reduced adhesive force by heat applying is used as the adhesive layer, then the dicing sheet with the protective film forming layer may be heated at the step (3) in order to make release easy.

Next, it is preferable to laser print to the cured protective film forming layer (the protective film). The laser printing is carried out by a laser marking method, the product number is marked to the protective film by grinding off the surface of the protective film over the adhesive sheet by irradiating the laser beam. According to the dicing sheet with the protective film forming layer of the present invention, even if the wafer is extremely thin, the warpage of the wafer can be suppressed, thus the focus point of the laser beam is determined accurately, and the marking can be done precisely.

Next, the multilayered body of the semiconductor wafer and the dicing sheet with the protective film forming layer (the multilayered body of the semiconductor wafer, the protective film and the adhesive sheet) is diced for each circuit formed on the wafer surface. The dicing is carried out by cutting the wafer and the protective film. The dicing is not particularly limited, and as an example, the method of fixing the surrounding part (the outer peripheral part of the adhesive sheet) of the dicing sheet of the protective film forming layer by the ring frame during the dicing of the wafer, then forming a chip of the wafer by known means such as by using the rotating circular blade such as the dicing blade or so may be mentioned. The depth of the cut to the adhesive sheet by the dicing only needs to be the depth which completely cuts the protective film forming layer, and it is preferably 0 to 30 μm from the boundary face of the protective film forming layer. By making the amount of the cut to the base film small, the melting of the base film by the abrasion of the dicing blade, or burr or so at the base film can be suppressed. Also, between the protective film forming layer and the adhesive sheet, the heat resistant resin layer is provided, and in case the heat resistant resin layer is a material which does not expand so that it does not suited for expanding, then by dicing so as to completely cut the heat resistant resin layer, the expanding of the dicing sheet is not interfered by the heat resistant resin layer, thus the effect of the present invention is exhibited.

Then, the above mentioned adhesive sheet is expanded. The adhesive sheet of the present invention has excellent elongation property, hence the dicing sheet with the protective film forming layer of the present invention has excellent expanding property. By picking up the diced semiconductor chip with the protective film using widely known means such as a collet or so, the protective film and the adhesive sheet are released. Also, in case the heat resistant resin layer is provided between the protective film forming layer and the adhesive sheet, the semiconductor chip with the protective film is released from the heat resistant resin layer. As a result, the semiconductor chip having the protective film at the backside (the semiconductor chip with the protective film) can be obtained. According to the present invention, the protective film with high uniformity of the thickness can be easily formed at the chip backside, thus the cracks caused during the dicing step or packaging becomes difficult to occur. Also, according to the present invention, compared to the conventional steps wherein the wafer formed with the protective film was adhered to the dicing tape for dicing; the chip with the protective film can be obtained without adhering to the dicing tape, thus the production steps can be made simple. Also, since the wafer which has become fragile due to the grinding will not be handled singularly, hence the risk of the wafer breakage can be reduced. Further, the warpage of the thin wafer sometimes occurs due to the curing contraction of the protective film, however the curving can be suppressed since it is held by the adhesive sheet. Further, the semiconductor device can be produced by mounting the semiconductor chip on the predetermined substrate by face down method. Also, the semiconductor device can be produced by adhering the semiconductor chip comprising the protective film on the backside to other members (on the chip mounting member) such as the die pad part or other semiconductor chip or so.

EXAMPLE

Hereinafter, the present invention will be described based on the examples, however the present invention is not to be limited thereto. Note that, in the below examples and the comparative examples, <the wafer holding property and the dicing property>, <the expanding property>, <the total light transmittance rate at the wavelength of 532 nm and 1064 nm>, <the evaluation of the laser printing>, <the melting point of the base film>, <the thermal shrinkage ratio> and <the rupture elongation of the base film and the stress at 25%> were measured evaluated as following. Also, the following <the protective film forming layer composition> and <the adhesive composition> were used.

<The Wafer Holding Property and the Dicing Property>

The protective film forming layer of the dicing sheet with the protective film forming layer is adhered to the silicon wafer (the diameter of 8 inch, the thickness of 200 μm, #2000 polishing), and the adhesive layer of the outer peripheral part of the adhesive sheet was adhered to the ring frame. Next, the protective film forming layer was cured by heating for 2 hours at 130° C., then the silicon wafer with the protective film was diced into a chip size of 5 mm×5 mm. The presence of the sagging (the wafer holding property) of the sheet was verified by visual checking after the heat curing, and if the sagging of the sheet was not present then it was evaluated "A", and if the sagging was present then it was evaluated "B". Also, the contacts between the adjacent chips were verified by visual checking (the dicing property) after the dicing, and if the contacts between the adjacent chips were not observed then it was evaluated as "A", and if the contacts between the adjacent chips were observed then it was evaluated as "B". Note that, after the evaluations, the pickup of the chip was carried out according to the normal method.

<The Expanding Property>

The protective film forming layer of the dicing sheet with the protective film forming layer is adhered to the silicon wafer (the diameter of 8 inch, the thickness of 200 μm, #2000 polishing), and the adhesive layer of the outer peripheral part of the adhesive sheet was adhered to the ring frame. Next, the protective film forming layer was cured by heating for 2 hours at 130° C., then the silicon wafer with the protective film was diced into a chip size of 5 mm×5 mm. Then, by using the die bonder (Bestem-D02, made by Canon Machinery Inc.), and the expanding was carried out at the dropping amount of 3 mm. The presence of the breakage of the base film during the expanding was verified, and if the expanding is possible and that there is no breakage in the base film, then it was evaluated as "A", or if the base film is broken then it was evaluated as "B".

<The Total Light Transmittance Rate at the Wavelength of 532 nm and 1064 nm>

By using UV-vis spectroscope (made by Shimadzu Corporation), in case of the dicing sheet with the protective film forming layer of the embodiment of FIG. 1 (the first preferable embodiment), the total light transmittance rate at the wavelength of 532 nm and 1064 nm of the adhesive sheet were measured. Also, in case the dicing sheet with the protective film forming layer of the embodiment of FIG. 2 (the second preferable embodiment), the total light transmittance rate at the wavelength of 532 nm and 1064 nm of the base film were measured.

<The Laser Printing Evaluation>

As same as the evaluation of the wafer holding property and the dicing property, the protective film forming layer of the dicing sheet with the protective film forming layer was adhered to the silicon wafer, and the adhesive layer was adhered to the ring frame, then the heat curing of the protective film forming layer was carried out. Next, using YAG laser marker (LM5000, the laser wavelength: 532 nm, made by Hitachi Construction Machinery Co., Ltd.), it was laser printed to the protective film over the adhesive sheet or the base film. Then, the adhesive sheet or the base film was released, then it was verified using the CCD camera whether the printings on the protective film can be read or not. If it was able to be read then it was evaluated as "A", if it was not able to be read then it was evaluated as "B". Note that, the size of the letter was the width of 400 μm, the height of 200 μm.

<The Melting Point of the Base Film>

The melting point of the base film was measured in accordance with JIS K7121:1987.

<The Thermal Shrinkage Rate of the Base Film>

The base film was cut into 10 cm×10 cm, then it was introduced into the hot air oven (for 2 hours at 130° C.). Then, the base film was taken out, and the size of the base film was measured, then the thermal shrinkage rate was obtained based on the following equation.

The thermal shrinkage rate (%)={(the area of the base film before the introduction)−(the area of the base film after the introduction)}/the area of the base film before the introduction×100

<The Rupture Elongation of the Base Film and the Stress at 25% Elongation>

The rupture elongation of the base film was measured using the universal tensile test machine (TENSILON RTA-T-2M made by ORIENTEC Co., Ltd.), in accordance with JIS K7161:1994, under the atmosphere of the humidity of 50% and at 23° C., at the tensile speed of 200 mm/min, using the sample length of 50 mm. The measurement was carried out to both the MD direction and the CD direction. Note that, the rupture elongation is the elongation rate during the rupture.

Also, the stress at 25% of the base film was calculated by dividing the force measured at the 12.5 mm elongation, with the cross section of the sample.

<The Protective Film Forming Layer Composition>

Each component and the blending amount constituting the protective film forming layer are shown in below (each component/the blending amount).

(A) the binder polymer component: acrylic polymer comprising n-butyl acrylate 55 parts by weight, methyl methacrylate 15 parts by weight, glycidyl methacrylate 20 parts by weight, and 2-hydroxyethyl acrylate 15 parts by weight (the weight average molecular weight: 900000, the glass transition temperature: −28° C.)/100 parts by weight (B) The curable component:

(B1) the heat curable component comprising bisphenol A type epoxy resin (epoxy equivalent 180 to 200 g/eq) 50 parts by weight, dicyclopentadiene type epoxy resin (EPICLONHP-7200HH made by DIC Corporation) 50 parts by weight/(total of 100 parts by weight)

(B2) thermoactive latent epoxy resin curing agent (dicyandiamide (ADEKA HARDNER 3636AS made by ADEKA Corporation)/2.8 parts by weight (C) the coloring agent: carbon black/10.0 parts by weight (D) the heat curing catalyst (2-phenyl-4,5-dihydroxymethylimidazol (CUREZOL 2PHZ made by SHIKOKU CHEMICALS CORPORATION)/2.8 parts by weight (E) the coupling agent: silane coupling agent (A-1110 made by NUC Corporation)/1 parts by weight (F) the inorganic filler: silica filler (fused quartz filler (the average particle diameter 8 μm))/300 parts by weight <The Adhesive Composition 1>

The silicone based adhesive composition comprising 60 parts by weight of KS847H made by Shin-Etsu Chemical Co., Ltd., 30 parts by weight of SD 4584 made by Dow Corning Toray Co., Ltd., and 0.5 parts by weight of SRX 212 made by Dow Corning Toray Co., Ltd.

<The Adhesive Composition 2>

The silicone based adhesive composition comprising 100 parts by weight of silicone CF-2017 made by Dow Corning Toray Co., Ltd., and 1 parts by weight of SRX212 made by Dow Corning Toray Co., Ltd.

Example 1

The above mentioned each components of the protective film forming layer composition were blended by the above mentioned blended amount. Also, as the release sheet, polyethylenetelephthalate film (SP-PET 381031, thickness of 38 μm, the surface tension of less than 30 mN/m, the melting point of 200° C. or higher, made by Lintec Corporation) carried out with the release treatment at the one side were prepared.

Methylethylketone solution of the above mentioned protective film forming layer composition (the solid concentration of 61 wt %) was coated on the release treatment face of the above mentioned release sheet so that the thickness after drying is 25 μm, and dried (the drying condition: 120° C. for 3 minutes in the oven); thereby the protective film forming layer was formed on the release sheet. Next, the protective film forming layer on the release sheet was cutout as the same size as (the diameter of 8 inch) the silicon wafer, and the protective film forming layer which has been cutout in a circular shape was obtained.

As the base film, the corona treatment was carried out to polypropylene film having a thickness of 100 μm (PYLEN film CTP1147 made by TOYOBO CO., LTD.), then toluene solution (the solid concentration of 20 wt %) of the above mentioned adhesive composition 1 was coated on the corona treated surface so that the thickness after the drying is 5 μm, then dried (the drying condition: 120° C. for 3 minutes in the oven); thereby the adhesive layer was formed on the base film and obtained the adhesive sheet. Note that, in case the following base film is corona treated, then the adhesive layer is formed on the corona treated face of the base film unless mentioned otherwise.

The above mentioned protective film forming layer was adhered on the adhesive layer of the above mentioned adhesive sheet, then it was cutout in a concentric circular shape along the outer diameter (the diameter of 260 mm) of the margin of the adhesives with respect to the ring frame. Then, the release sheet on the protective film forming layer was released, and the dicing sheet with the protective film forming layer of the embodiment of FIG. 1 was obtained. Each evaluation result is shown in Table 1.

Example 2

The dicing sheet with the protective film forming layer was obtained as same as the example 1 except that polypropylene film having the thickness of 50 μm (suntox-CP KT made by SunTox Co., Ltd.) carried out with the corona treatment was used as the base film. Each evaluation results are shown in Table 1.

Example 3

The dicing sheet with the protective film forming layer was obtained as same as the example 1 except for using polybutylenetelephthalate film having the thickness of 100 μm as the base film. Each evaluation results are shown in Table 1.

Comparative Example 1

The dicing sheet with the protective film forming layer was obtained as same as the example 1 except that the adhesive tape was obtained by preparing polyethylenetelephthalate film (SP-PET38E-0010YC, the thickness of 38 μm, the surface tension of less than 30 mN/m, and the melting point of 200° C. or higher, made by Lintec Corporation) carried out with the release treatment on the one side, and coating toluene solution (the solid concentration of 20 wt %) of the above mentioned adhesive composition 1 on the release treated face so that the thickness after the drying is 5 μm, then dried (the drying condition: 120° C. for 3 minutes in the oven); followed by transferring to the polyethylene film carried out with the corona treatment having the thickness of 110 μm as a base film. The base film changed the shape as it melted during the heat curing of the protective film forming layer, thus the evaluation of the dicing property, expanding property and the laser printing property were unable. Also, the shape of the base film were not maintained, hence the thermal shrinkage rate was unable to measure. Each evaluation results are shown in Table 1.

Comparative Example 2

The dicing sheet with the protective film forming layer was obtained as same as the comparative example 1 except for using polypropylene film (FOP-K made by FUTAMURA CHEMICAL CO., LTD.) having the thickness of 50 μm carried out with the corona treatment as the base film. The base film had a sagging during the heat curing of the protective film forming layer, hence the evaluation of the dicing property, expanding property and the laser printing property were unable. Each evaluation results are shown in Table 1.

Comparative Example 3

The dicing sheet with the protective film forming layer was obtained as same as the example 1 except for using polycarbonate film (Q51 made by Teijin DuPont Films Japan Limited) having the thickness of 150 μm as the base film. Each evaluation results are shown in Table 1.

Comparative Example 4

The dicing sheet with the protective film forming layer was obtained as same as the example 1 except for using polyimide film (Kapton 500HV made by DU PONT-TORAY CO., LTD) having the thickness of 125 μm as the base film. Each evaluation results are shown in Table 1.

TABLE 1

|  | Example 1 | Example 2 | Example 3 | Comparative Example 1 | Comparative Example 2 | Comparative Example 3 | Comparative Example 4 |
| --- | --- | --- | --- | --- | --- | --- | --- |
| The base film | PP | PP | PBT | PE | PP | PC | PI |
| The wafer holding property | A | A | A | B | B | A | A |
| The dicing property | A | A | A | — | — | A | A |
| The expanding property | A | A | A | — | — | B | B |
| The total light transmittance (%) at the wavelength of 532 nm | 90 | 85 | 88 | 88 | 89 | 88 | 18 |
| The total light transmittance (%) at the wavelength of 1064 nm | 91 | 85 | 90 | 90 | 91 | 88 | 47 |
| The laser printing property | A | A | A | — | — | A | B |
| The melting point of the base film (° C.) | 135 | 140 | 225 | 110 | 125 | 240 | none |
| The thermal shrinkage ratio of the base film (%) | 2.7 | 2.6 | 0.5 | — | 6.5 | 0.2 | 0.1 |
| The rupture elongation of the base film (%) (MD/CD) | 700/700 | 690/700 | 600/480 | 290/560 | 164/183 | 77/70 | 48/50 |
| The stress at 25% of the base film (MPa) (MD/CD) | 28/30 | 28/32 | 27/25 | 9/8 | 56/55 | 132/115 | 80/80 |

Example 4

As same as in the example 1, the protective film forming layer being cutout into a circular shape placed on the release sheet was obtained.

Polypropylene film having a thickness of 100 μm (PYLEN film CTP1147 made by TOYOBO CO., LTD.) was prepared as the base film. Next, the release sheet on the protective film forming layer was released, and the base film and the protective film forming layer were stacked.

Toluene solution (the solid concentration 35 wt %) of the above mentioned adhesive composition 2 was coated on the release treated face of polyethylenetelephthalate film (SP-PET38E-0010YC, thickness of 38 μm, the surface tension of less than 30 mN/m, the melting point of 200° C. or higher, made by Lintec Corporation) carried out with the release treatment on the one side so that the thickness after the drying is 5 μm, then dried (the drying condition: 120° C. for 3 minutes in the oven). To the formed adhesive layer, the release treatment face of polyethylenetelephthalate film (SP-PET38E-0010YC, thickness of 38 μm, the surface tension of less than 30 mN/m, the melting point of 200° C. or higher, made by Lintec Corporation) carried out with the release treatment on the one side were adhered. Next, it was cutout into a circular shape from one of the release sheet side along the inner diameter (255 mm) of the ring frame, then the redundant part was removed to form the opening part. Next, the release sheet of the side being cutout on the adhesive sheet surrounding the opening part was removed to expose the adhesive layer; then the above mentioned base film and the exposed face of the adhesive layer were stacked so that the opening part and the protective film forming layer are on a concentric circle to form the multilayered body.

The above mentioned multilayered body was made to have the outer diameter 260 mm of the margin of the adhesives against the ring frame so that it does not exceed the outer diameter (275 mm) of the ring frame, then it was cutout in a concentric circular shape together with the opening part and the protective film forming layer. Then, the remaining release sheet was released, and the dicing sheet with the protective film forming layer of the embodiment of FIG. 2 was obtained. Each evaluation results are shown in Table 2.

Example 5

The dicing sheet with the protective film forming layer was obtained as same as the example 4 except for using polypropylene film (suntox-CP KT made by SunTox Co., Ltd.) having the thickness of 50 μm as the base film. Each evaluation results are shown in Table 2.

Example 6

The dicing sheet with the protective film forming layer was obtained as same as the example 4 except for using polybutylenetelephthalate film having the thickness of 100 μm as the base film. Each evaluation results are shown in Table 2.

The Comparative Example 5

The dicing sheet with the protective film forming layer was obtained as same as the example 4 except for using the polyethylene film having the thickness of 110 μm as the base film. The base film changed the shape by melting during the heat curing of the protective film forming layer, thus the evaluation of the dicing property, expanding property and the laser printing property were unable. Also, the shape of the base film were not held, hence the thermal shrinkage rate was unable to measure. Each evaluation results are shown in Table 2.

Comparative Example 6

The dicing sheet with the protective film forming layer was obtained as same as the comparative example 5 except for using polypropylene film (FOP-K made by FUTA-MURA CHEMICAL CO., LTD.) having the thickness of 50 μm carried out with the corona treatment as the base film. The base film had a sagging during the heat curing of the protective film forming layer, hence the evaluation of the dicing property, expanding property and the laser printing property were unable. Each evaluation results are shown in Table 2.

The Comparative Example 7

The dicing sheet with the protective film forming layer was obtained as same as the example 4 except for using polycarbonate film having the thickness of 150 nm as the base film. Each evaluation results are shown in Table 2.

The Comparative Example 8

The dicing sheet with the protective film forming layer was obtained as same as the example 4 except for using polyimide film (Kapton 500HV made by DU PONT-TORAY CO., LTD) having the thickness of 125 μm as the base film. Each evaluation results are shown in Table 2.

TABLE 2

|  | Example 4 | Example 5 | Example 6 | Comparative Example 5 | Comparative Example 6 | Comparative Example 7 | Comparative Example 8 |
| --- | --- | --- | --- | --- | --- | --- | --- |
| The base film | PP | PP | PBT | PE | PP | PC | PI |
| The wafer holding property | A | A | A | B | B | A | A |
| The dicing property | A | A | A | — | — | A | A |
| The expanding property | A | A | A | — | — | B | B |
| The total light transmittance (%) at the wavelength of 532 nm | 90 | 85 | 88 | 88 | 89 | 88 | 18 |
| The total light transmittance (%) at the wavelength of 1064 nm | 91 | 85 | 90 | 90 | 91 | 88 | 47 |
| The laser printing property | A | A | A | — | — | A | B |
| The melting point of the base film (° C.) | 135 | 140 | 225 | 110 | 125 | 240 | none |
| The thermal shrinkage ratio of the base film (%) | 2.7 | 2.6 | 0.5 | — | 6.5 | 0.2 | 0.1 |

TABLE 2-continued

|  | Example 4 | Example 5 | Example 6 | Comparative Example 5 | Comparative Example 6 | Comparative Example 7 | Comparative Example 8 |
|---|---|---|---|---|---|---|---|
| The rupture elongation of the base film (%) (MD/CD) | 700/700 | 690/700 | 600/480 | 290/560 | 164/183 | 77/70 | 48/50 |
| The stress at 25% of the base film (MPa) (MD/CD) | 28/30 | 28/32 | 27/25 | 9/8 | 56/55 | 132/115 | 80/80 |

REFERENCES O NUMERICALS

1 . . . The base film
2 . . . The adhesive layer
3 . . . The adhesive sheet
4 . . . The protective film forming layer
5 . . . The ring frame
10 . . . The dicing sheet with the protective film forming layer

The invention claimed is:

1. A dicing sheet with a protective film forming layer, comprising:
   a) an adhesive sheet comprising a base film and an adhesive layer, said base film comprising a polypropylene film; and
   b) a protective film forming layer;
   wherein (1) the protective film forming layer is formed on the adhesive layer at an inner peripheral part of the adhesive sheet and the adhesive layer is exposed at an outer peripheral part of the adhesive sheet, or (2) the protective film forming layer is formed at the inner peripheral part of the base film and the adhesive layer is formed at the outer peripheral part of the base film, and
   wherein said base film has following characteristics (a) to (c):
   (a) a melting point higher than 130° C.,
   (b) a thermal shrinkage ratio under the heating at 130° C. for 2 hours is −5 to +5%, and
   (c) a rupture elongation of a machine direction (MD) and a cross-direction (CD) is 100% or more, and a stress at 25% elongation is 100 MPa or less.

2. The dicing sheet with the protective film forming layer as set forth in claim 1, wherein said protective film forming layer is thermosetting.

3. The dicing sheet with the protective film forming layer as set forth in claim 1, wherein said protective film forming layer comprises a binder polymer component (A) and a curable component (B).

4. The dicing sheet with the protective film forming layer as set forth claim 1, wherein said protective film forming layer comprises a coloring agent (C), and a maximum transmittance rate of the protective film forming layer at a wave length of 300 to 1200 nm is 20% or less.

5. The dicing sheet with the protective film forming layer as set forth in claim 1, wherein the protective film forming layer is formed on the adhesive layer at an inner peripheral part of the adhesive sheet, and the adhesive layer is exposed at an outer peripheral part of the adhesive sheet.

6. The dicing sheet with the protective film forming layer as set forth in claim 1 comprising the protective film forming layer formed at the inner peripheral part of the base film, and the adhesive layer formed at the outer peripheral part of the base film.

7. A production method of a chip comprising an adhering of the protective film forming layer of the dicing sheet as set forth in claim 5 to a workpiece, and carrying out following steps (1) to (3);
   step (1): obtaining a protective film by curing the protective film forming layer,
   step (2): dicing the workpiece and the protective film, and
   step (3): releasing between the adhesive sheet and the protective film.

8. A production method of a chip comprising an adhering of the protective film forming layer of the dicing sheet as set forth in claim 6 to a workpiece, and carrying out following steps (1) to (3);
   step (1): obtaining a protective film by curing the protective film forming layer,
   step (2): dicing the workpiece and the protective film, and
   step (3): releasing between the base film and the protective film.

9. The production method of a chip as set forth in claim 7, wherein the protective film forming layer is thermosetting, and the steps (1) to (3) are carried out in an order of (1), (2), (3).

10. The production method of the chip as set forth in claim 9 wherein following step (4) is carried out after the step (1);
    step (4): laser printing on the protective film.

* * * * *